United States Patent
Nanda et al.

(10) Patent No.: US 7,279,393 B2
(45) Date of Patent: Oct. 9, 2007

(54) TRENCH ISOLATION STRUCTURE AND METHOD OF MANUFACTURE THEREFOR

(75) Inventors: Arun Nanda, Singapore (SG); Nace Rossi, Singapore (SG); Ranbir Singh, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 90 days.

(21) Appl. No.: 10/953,632

(22) Filed: Sep. 29, 2004

(65) Prior Publication Data

US 2006/0068562 A1    Mar. 30, 2006

(51) Int. Cl.
*H01L 21/76*      (2006.01)
*H01L 21/336*    (2006.01)
*H01L 21/8238*  (2006.01)

(52) U.S. Cl. .................... 438/424; 438/425; 438/427; 438/435; 438/296; 438/221; 438/400; 438/248; 257/E21.549

(58) Field of Classification Search ............... 438/424, 438/425, 427, 435, 296, 221, 400, 248
See application file for complete search history.

(56) References Cited

U.S. PATENT DOCUMENTS

| 5,436,488 | A  | * | 7/1995  | Poon et al. ............... 257/397 |
| 6,486,039 | B2 | * | 11/2002 | Yoo et al. ................. 438/425 |
| 6,576,530 | B1 | * | 6/2003  | Chen et al. ............... 438/435 |
| 2002/0137279 | A1 | * | 9/2002 | Park et al. ................ 438/248 |
| 2002/0142622 | A1 | * | 10/2002 | Iijima et al. ............. 438/768 |
| 2004/0251511 | A1 | * | 12/2004 | Desko et al. ............ 257/499 |
| 2005/0167778 | A1 | * | 8/2005  | Kim et al. ................ 257/510 |
| 2005/0266655 | A1 | * | 12/2005 | Nemani et al. .......... 438/435 |
| 2005/0282353 | A1 | * | 12/2005 | Wise et al. .............. 438/435 |

* cited by examiner

*Primary Examiner*—Michael Lebentritt
*Assistant Examiner*—Mohsen Ahmadi

(57) ABSTRACT

The present invention provides a trench isolation structure, a method for manufacturing a trench isolation structure, and a method for manufacturing an integrated circuit including the trench isolation structure. In one aspect, the method includes forming a hardmask over a substrate, etching a trench in the substrate through the hardmask, forming a liner in the trench, depositing an interfacial layer over the liner within the trench and over the hardmask and filling the trench with a dielectric material.

13 Claims, 8 Drawing Sheets

TRENCH ISOLATION STRUCTURE AND METHOD OF MANUFACTURE THEREFOR

TECHNICAL FIELD OF THE INVENTION

The present invention is directed, in general, to isolation structures for an integrated circuit and, more specifically, to a trench isolation structure, a method of manufacture therefor, and a method of manufacturing an integrated circuit including the trench isolation structure.

BACKGROUND OF THE INVENTION

Integrated circuits are now well known and extensively used in various technologies. Over the last decade, the operating speeds and packing densities have increased substantially while the device size has been dramatically reduced. The combination of increased packing density and device size reduction have posed ever new problems for the semiconductor fabrication industry that have not previously been of concern. One such area of fabrication involves the formation of isolation structures located on the semiconductor wafer substrate, between transistor devices, to provide electrical isolation between the devices. A variety of techniques, generally termed isolation processes, have been developed to isolate transistors in integrated circuits.

One such process is local oxidation of silicon (LOCOS), in which a silicon nitride ($Si_3N_4$) film is used to isolate selected regions of the semiconductor substrate in which field oxide structures are formed. This isolation technique has been widely used as an isolation technique of very large-scale integrated (VLSI) circuits. While this technique has been quite useful and extensively used in larger submicron devices, its use in smaller, present day submicron technologies has encountered limitations due to the increased packing density.

To overcome the limitations associated with the LOCOS process, the industry devised an alternative isolation process known as shallow trench isolation (STI). This particular process provides an isolation structure that requires less surface area on the semiconductor substrate. However, even this process has encountered limitations in view of the advent of layout schemes that include high and low component density areas.

After filling the trench with the oxide, a planarization process is conducted and the oxide is over polished to make certain that the oxide is removed everywhere on the wafer down to the underlying hardmask and that there are not any areas on the wafer that have oxide remaining on the surface of the hardmask. A draw back to this over polish step, however, is that dishing of the oxide within the trench may occur in certain areas of the wafer, which results in the hardmask being higher than the oxide. When the hardmask is removed, a corner portion of the oxide is removed to form trench encroachments on either side of the trench. These encroachments become gathering spots for polysilicon during the poly gate deposition step. This polysilicon is difficult to remove, and the polysilicon filled trench encroachment areas can produce some leakage from the sub-threshold voltage degradation that will, in turn, affect device performance.

In attempts to overcome this trench encroachment problem, some manufacturers have chosen to dramatically increase the thickness of the hardmask layer. This procedure, unfortunately, has the drawback of causing problems with the lithographic processes used to pattern the hardmask. In addition, the added thickness in the hardmask increases the aspect ratio, which makes it more difficult to fill the trench with the oxide. Another attempt to correct the trench encroachment problem has been to modify the slurry used to remove the oxide. This attempt, however, has also encountered problems in variation in pattern density in those layout schemes involving high density component areas and low density component areas.

Accordingly, what is needed in the art is a trench isolation structure that does not experience the trench encroachment experienced by the conventional methods.

SUMMARY OF THE INVENTION

To address the above-discussed deficiencies of the prior art, the present invention provides a trench isolation structure, a method for manufacturing a trench isolation structure, and a method for manufacturing an integrated circuit, including the trench isolation structure. In one embodiment, the method includes forming a hardmask over a substrate, etching a trench in the substrate through the hardmask, forming a liner in the trench, depositing an interfacial layer over the liner within the trench and over the hardmask and filling the trench with a dielectric material. The method for manufacturing the integrated circuit is similar to the method for forming the trench isolation structure, however, it also includes the steps of forming transistor devices over the substrate, and constructing an interlevel dielectric layer over the transistor devices and forming interconnects in the interlevel dielectric layer. The interconnects contact and interconnect the transistor devices to form an operational integrated circuit.

In another embodiment, the trench isolation structure, includes a trench located in a semiconductor substrate, a liner located in the trench, an interfacial layer located over the oxide liner within the trench wherein an interface is located between the interfacial layer and the oxide liner. A dielectric material fills the trench.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGS. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
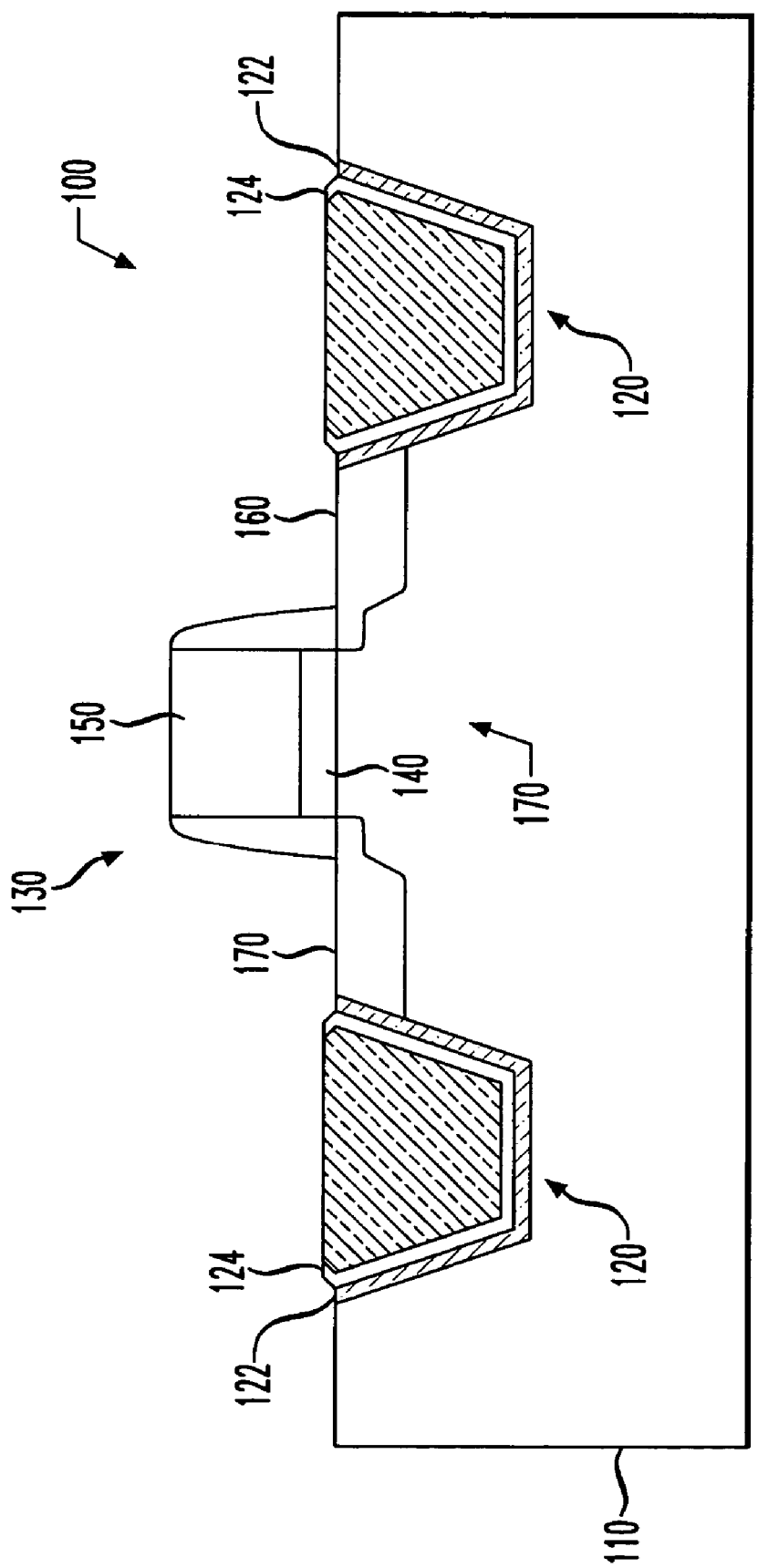
FIG. 1 illustrates a sectional view of one embodiment of a semiconductor device constructed according to the principles of the present invention.

Referring initially to FIG. 1, illustrated is a sectional view of one embodiment of a semiconductor device 100 constructed according to the principles of the present invention. In the embodiment illustrated in FIG. 1, the semiconductor device 100 includes a substrate 110. Located within the substrate 110 in the embodiment of FIG. 1 are isolation structures 120. An oxide liner 122 lines the interior wall of each of the isolation structure 120. Over lying each of the oxide liners 122 is an interface layer 124, which is discussed in more detail below.

In this particular embodiment the isolation structures 120 are shallow trench isolation (STI) structures, however, it should be noted that other isolation structures are within the broad scope of the present invention. These particular isolation structures 120, in contrast to those of the prior art, have no undercut at the upper corners where the isolation material of the isolation structures 120 meet the substrate 110. Fortunately, as compared to the prior art structures, the semiconductor device 100 experiences reduced, and optimally little or no leakage current at these corners.

Located between the isolation structures 120 in the embodiment of FIG. 1 is a conventional transistor 130. The conventional transistor 130 includes a conventional gate oxide 140 and a conventional gate electrode 150. The conventional transistor 130 further includes conventional source/drain regions 160 located between a channel region 170, which is positioned below the gate oxide 140, and the isolation structures 120.

Figure 2:
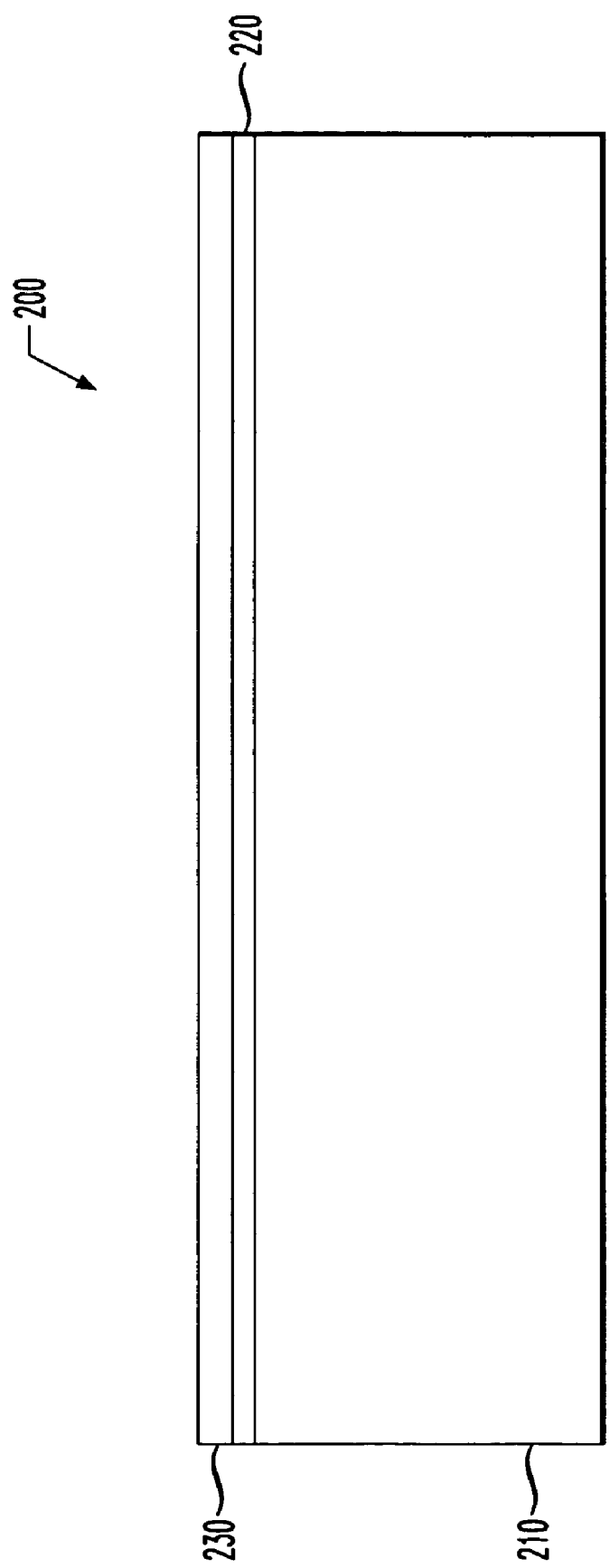
FIG. 2 illustrates a sectional view of a partially completed semiconductor device at an early stage of manufacture.

Turning now to FIGS. 2-7, illustrated are sectional views of detailed manufacturing steps instructing how one might, in an advantageous embodiment, manufacture a semiconductor device similar to the semiconductor device 100 depicted in FIG. 1. FIG. 2 illustrates a sectional view of a partially completed semiconductor device 200 at an early stage of manufacture. The partially completed semiconductor device 200 includes a substrate 210, which, in an exemplary embodiment, be any layer located in the partially completed semiconductor device 200, including a wafer itself or a layer located above the wafer (e.g., epitaxial layer). In the embodiment illustrated in FIG. 2, the substrate 210 is a P-type semiconductor substrate; however, one skilled in the art understands that the substrate 210 could be an N-type substrate without departing from the scope of the present invention.

Located over the substrate 210 in the embodiment shown in FIG. 2 is a pad oxide 220. The pad oxide 220 is a conventional structure often formed between the substrate 210 and a later formed hardmask layer. In the embodiment of FIGS. 2-7, the pad oxide 220 is a thin oxide layer having a thickness ranging from about 10 nm to about 20 nm. While the pad oxide 220 is generally grown, certain embodiments might exist where the pad oxide 220 is deposited. Located over the pad oxide 220 is a hardmask 230, such as a silicon nitride hardmask, however, other hardmask materials known to those skilled in the art could also be used. In an advantageous embodiment, the hardmask 230 has a thickness that is less than about 100 nm. However, greater thicknesses, for example 150 nm to about 200 nm may also be used if needed.

The hardmask 230 in the exemplary embodiment of FIG. 2 has been formed over the pad oxide 220 using conventional processes. For example, a conventional chemical vapor deposition (CVD) process, or another similar process could be used to form the hardmask 230. In one exemplary embodiment, the thickness of the hardmask 230 is less than about 100 nm. As mentioned above, it is desirable not to get the hardmask 230 too thick as it can interfere with the lithographic processes and may also detrimentally increase aspect ratios.

Figure 3:
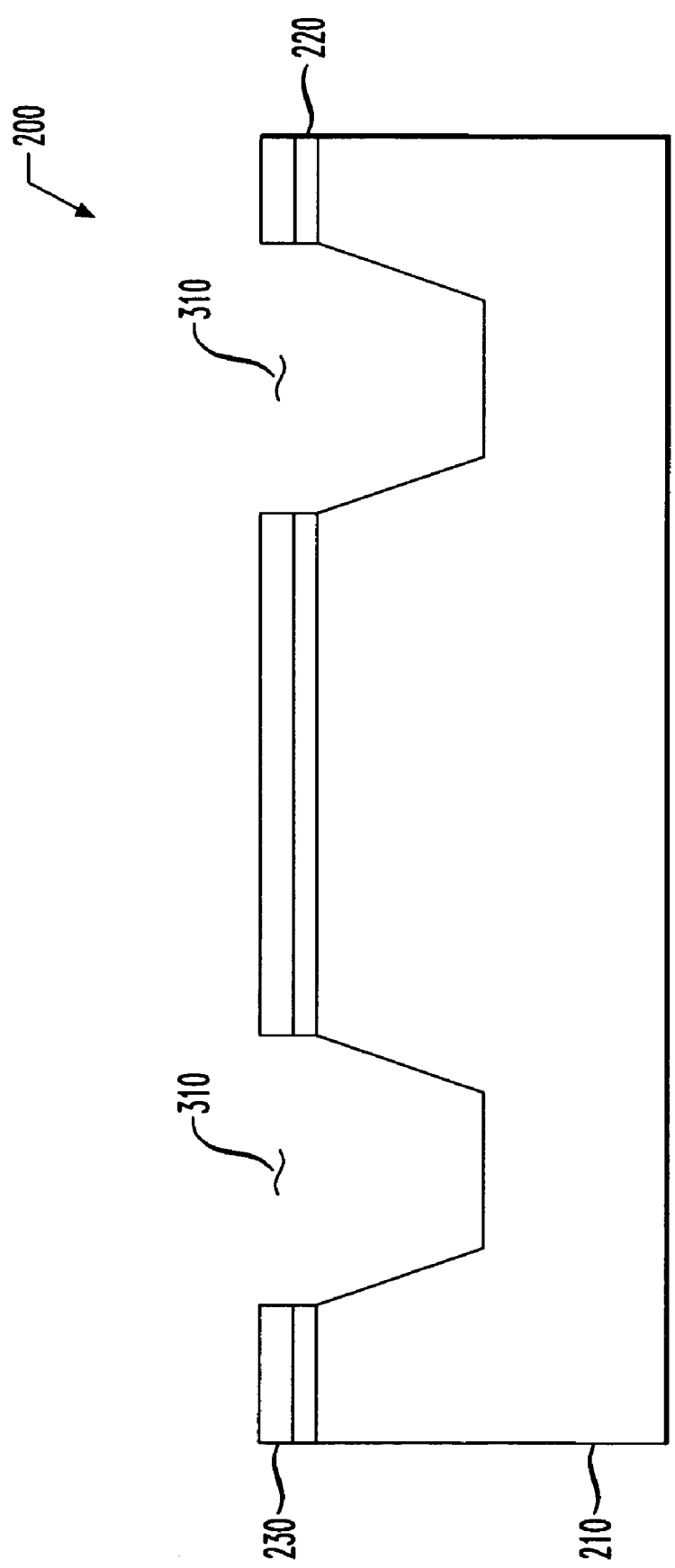
FIG. 3 illustrates a sectional view of the partially completed semiconductor device illustrated in FIG. 2 after patterning a pad oxide and hardmask, and thereafter forming trenches within a substrate through the hardmask.

Turning now to FIG. 3, illustrated is a sectional view of the partially completed semiconductor device 200 illustrated in FIG. 2 after patterning the pad oxide 220 and hardmask 230, and forming trenches 310 within the substrate 210 through the pad oxide 220 and the hardmask 230. Those skilled in the art understand the lithographic processes and techniques required to pattern the pad oxide 220 and hardmask 230, as well as form the trenches 310. Therefore, a detailed discussion of these processes is not necessary.

The trenches 310, which in the embodiment of FIG. 3 are shallow trenches, typically have a depth of about 0.1 µm to about 0.5 µm below the upper surface of the substrate 210. Similarly, the trenches 310 typically have widths at their opening ranging from about 0.15 µm to about 20 µm. The depth and width of the trenches 310 may vary, depending on design. As such, other depths and widths could conceivably be used in conjunction with the present invention.

Figure 4:
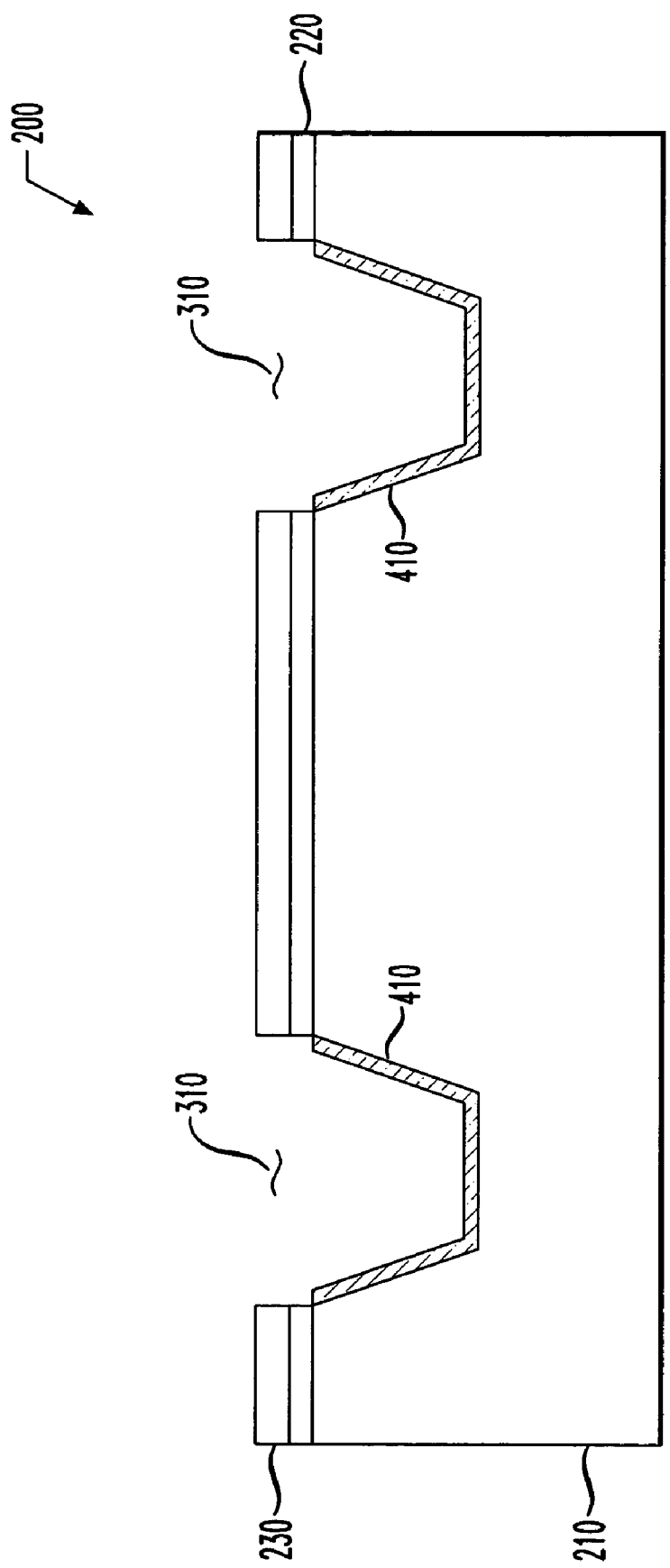
FIG. 4 illustrates a sectional view of the partially completed semiconductor device illustrated in FIG. 3 after forming a liner oxide within the trenches.

Turning now to FIG. 4, illustrated is a sectional view of the partially completed semiconductor device 200 illustrated in FIG. 3 after forming a liner 410, such as an oxide liner, within the trenches 310. The material used to form the liner 410 are conventional, and the line 410 may be grown using a conventional dry or wet oxidation process, but other known processes may be used. In an exemplarily embodiment, the liner 410 is formed substantially within the trenches 310. The thickness of the liner 410 may vary, however, it is often the case that the liner 410 has a thickness ranging from about 10 nm to about 30 nm.

Figure 5:
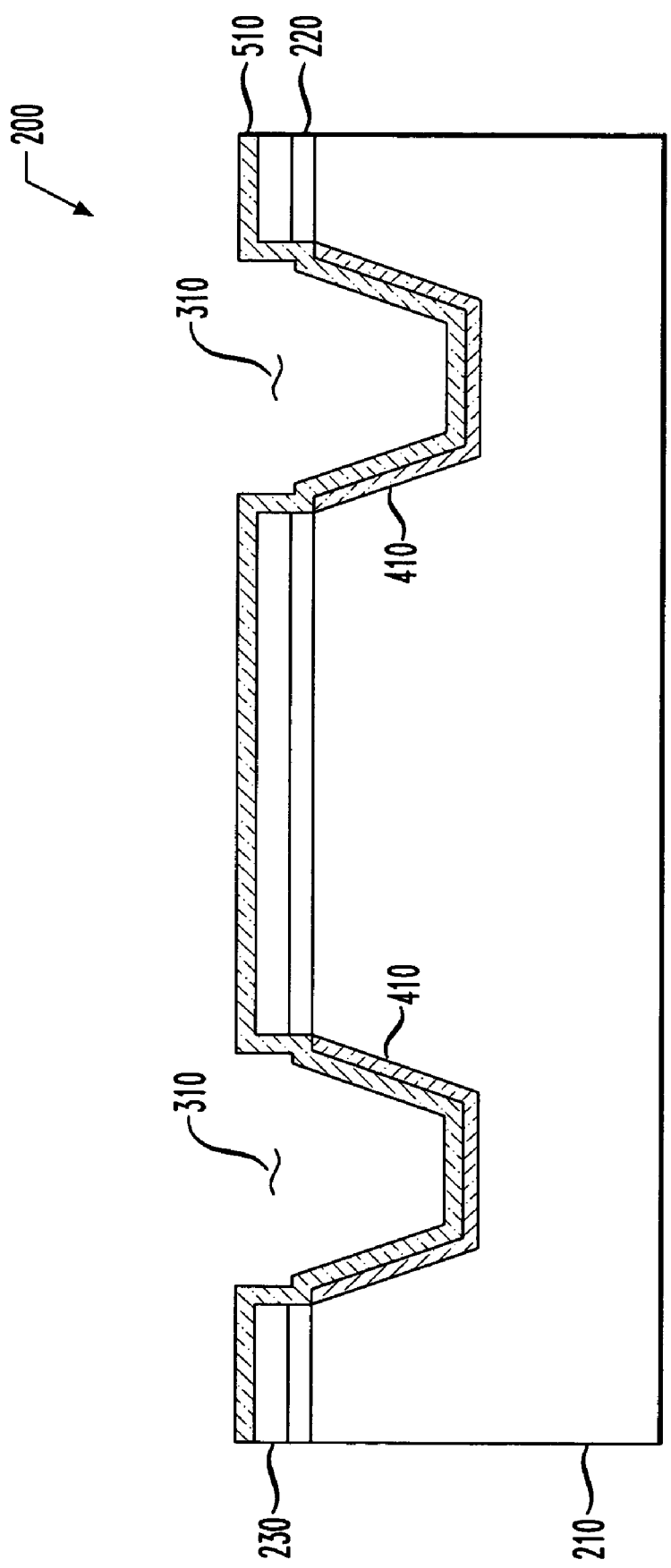
FIG. 5 illustrates a sectional view of the partially completed semiconductor device illustrated in FIG. 4 after deposition of the interfacial layer within the trenches and over the hardmask.

Turning now to FIG. 5, illustrated is a sectional view of the partially completed semiconductor device 200 illustrated in FIG. 4 after an interfacial layer 510 is formed over the hardmask 230 and the liner 410 and within the trenches 310. The interfacial layer 510 can be formed using chemical vapor deposition (CVD), including plasma enhanced CVD (PECVD), or physical vapor deposition (PVD) processes. The base materials used to deposit the interfacial layer 510 may vary and may comprise silicon, oxygen or nitrogen. By way of example only, the interfacial layer 510 may be a silicon rich layer, a silicon oxynitride layer, or a silicon nitride layer. The gas flows and other deposition parameters will also vary depending on the gases used to deposit the interfacial layer. For example, where the interfacial layer 510 is comprised of silicon oxynitride that is deposited by plasma enhanced CVD, a silane gas flow ranges from about 100 sccm to about 150 sccm, while a nitrogen oxide gas flow ranges from about 300 sccm to about 400 sccm. A helium gas flow, which is used as a carrier gas, ranges from about 2000 sccm to about 3000 sccm. A pressure ranging from about 4 Torr to about 8 Torr is maintained during deposition and at a power ranging from about 100 watts to about 150 watts.

In those embodiments where the interfacial layer 510 comprises silicon nitride deposited by PVD, a silane gas flow ranges from about 400 sccm to about 600 sccm, while an ammonia gas flow ranges from about 3000 sccm to about 50000 sccm, and a nitrogen gas flow ranges from about 300 sccm to about 500 sccm. A pressure ranging from about 2.5 Torr to about 3 Torr is maintained during deposition and at a power ranging from about 400 watts to about 600 watts.

In those embodiments where the interfacial layer 510 comprises silicon nitride deposited by CVD, a dichlorosilane gas flow ranges from about 150 sccm to about 250 sccm, an ammonia gas flow ranges from about 1000 sccm to about 1500 sccm, and a nitrogen gas flow ranges from about 25 sccm to about 100 sccm. The deposition is conducted at a pressure ranging from about 0.1 Torr to about 0.3 Torr and at a temperature ranging from about 740° C. to about 800° C.

In those embodiments where the interfacial layer 510 comprises a silicon rich oxide that is deposited by PECVD, a silane gas flow ranges from about 300 sccm to about 400 sccm, while a nitrogen oxide gas flow ranges from about 7000 sccm to about 8000 sccm. A pressure ranging from about 1.5 Torr to about 3 Torr is maintained during deposition and at a temperature ranging from about 350° C. to about 450° C., and at a power ranging from about watts to about 1000 watts.

Depending on the embodiment, the thickness of the interfacial layer 510 will also vary. For example, the thickness of the interfacial layer 510 may range from about 30 nm to about 90 nm. Also, the interfacial layer 510 preferably forms an interface with the liner 410. In most instances, this interface can be detected by using an electron microscopy analysis of cross sections.

The interfacial layer 510 provides several advantages over conventional structures. For example, the interfacial layer 510 can act as an additional polish stop layer, which allows better control over the STI elevation during polishing processes. As such, the interfacial layer 510 provides a way of more accurately stopping on the underlying nitride without excessive erosion of the trench. The use of the interfacial layer 510 also allows for the use of thinner nitride masks, since no over-polish of nitride will be necessary. For example in place of using a hardmask having a thickness in excess of 150 nm, the present invention allows for the use of a hardmask having a thickness of less than about 100 nm. This reduces lithographic or aspect ratio problems common the prior art processes discussed above. In addition, this thickness attribute can serve to prevent encroachment at the trench corners because the interfacial layer 510 minimizes corner attack or gate-wrap-around corner that occurs in conventional processes, and thereby alleviates leakage and threshold voltage problems associated with conventional processes. Due to these advantages, a more robust STI is provided, which in turn, provides for a more consistent production yield and overall better device performance.

Figure 6:
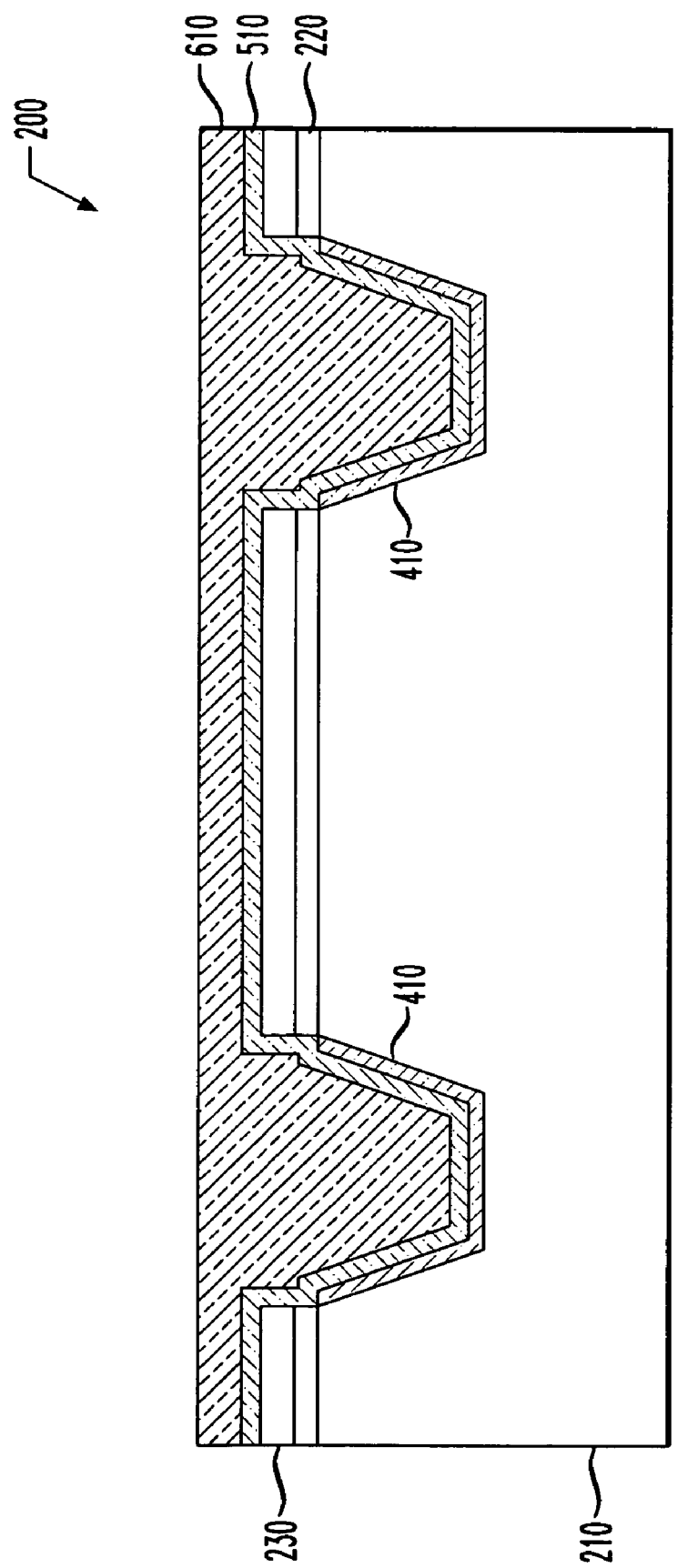
FIG. 6 illustrates a sectional view of the partially completed semiconductor device illustrated in FIG. 5 after the trenches have been filled with a dielectric material.

Turning now to FIG. 6, there is illustrated a sectional view of the partially completed semiconductor device 200 illustrated in FIG. 5 after conventional deposition of an dielectric material 610 within the trenches. The dielectric material 610, in an exemplary embodiment completely fills the trenches in a conformal fashion and an excess amount is deposited on top of the interfacial layer 510, as shown. The dielectric material 610 may comprise an oxide or another similar or well known material that is capable of providing the requisite electrical isolation for the semiconductor device 200.

Figure 7:
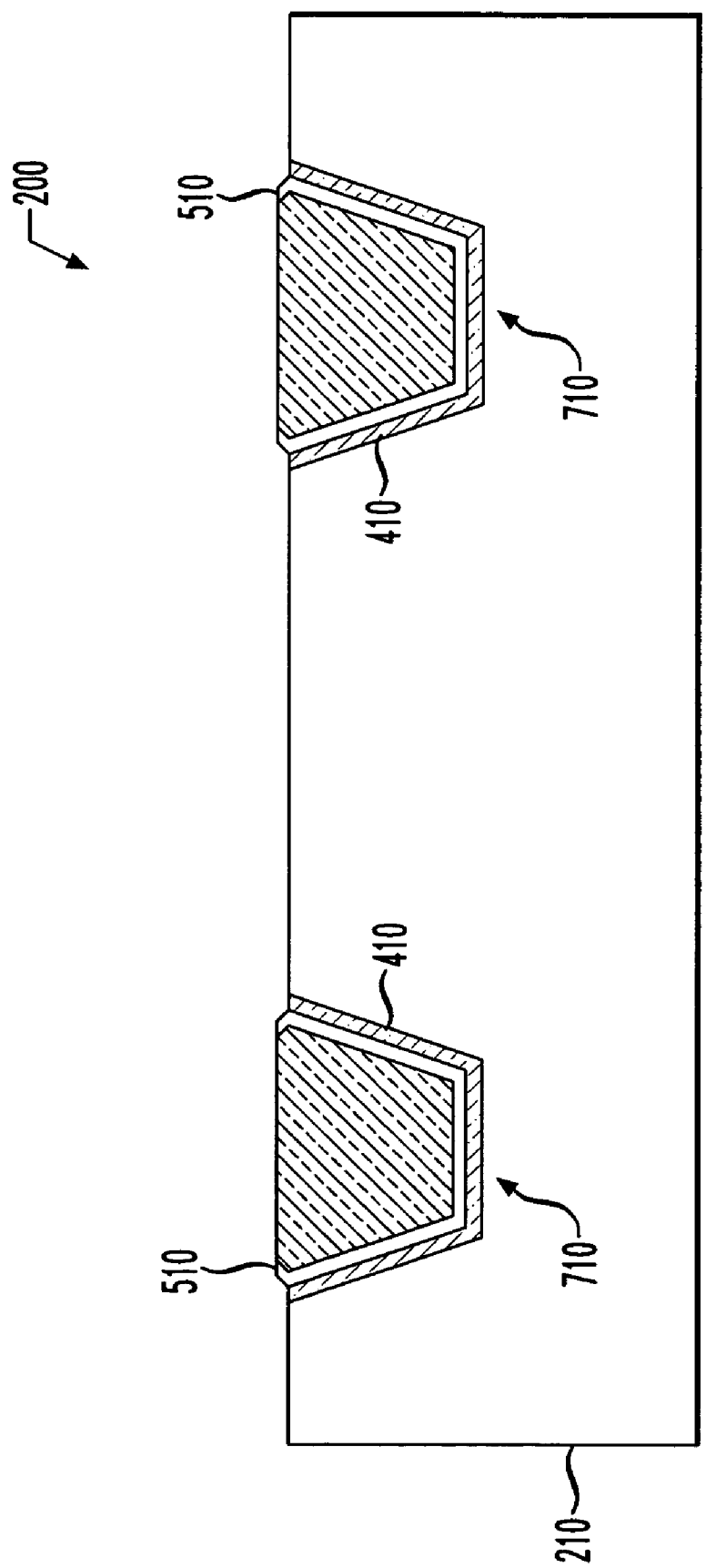
FIG. 7 illustrates a sectional view of the partially completed semiconductor device illustrated in FIG. 6 after conventional removal of the excess dielectric material, the hardmask and pad oxide, thus completing the isolation structures.

Turning now to FIG. 7, illustrated is a sectional view of the partially completed semiconductor device 200 illustrated in FIG. 6 after a conventional removal process, such as a conventional chemical-mechanical-polishing (CMP) process, which results in the isolation structures 710, as illustrated. The CMP process removes: the excess dielectric material 610 located over the interfacial layer 510, the portion of the interfacial layer 510 located on top of the hardmask 230, the hardmask 230 itself, and the pad oxide 223. As mentioned above, the dishing that is prevalent in conventional processes is not present in the present invention because of the use of the interfacial layer 510. As such, corner encroachment and its attending disadvantages are eliminated. Additionally, it should be noted that a portion of the isolation structure 710 and the interfacial layer extends slightly above the surface of the substrate 210 because the interfacial layer 510 allows for a more controlled CMP process. The CMP process may use a timed endpoint, or alternatively some sort of endpoint detection means, to determine when to stop. It is important, however, that the removal process does not over polish the dielectric material 610.

Ultimately what results are the isolation structures 710 that have substantially no undercut at the upper corners where the dielectric material 610 of the isolation structures 710 meet the substrate 210. This prevents a high dielectric field from occurring at these points, and thus substantially reduces the amount of leakage current that results. After the completion of the isolation structures 710 of FIG. 7, the manufacturing process would continue, resulting in a completed semiconductor device, similar to the completed semiconductor device 100 illustrated in FIG. 1.

Figure 8:
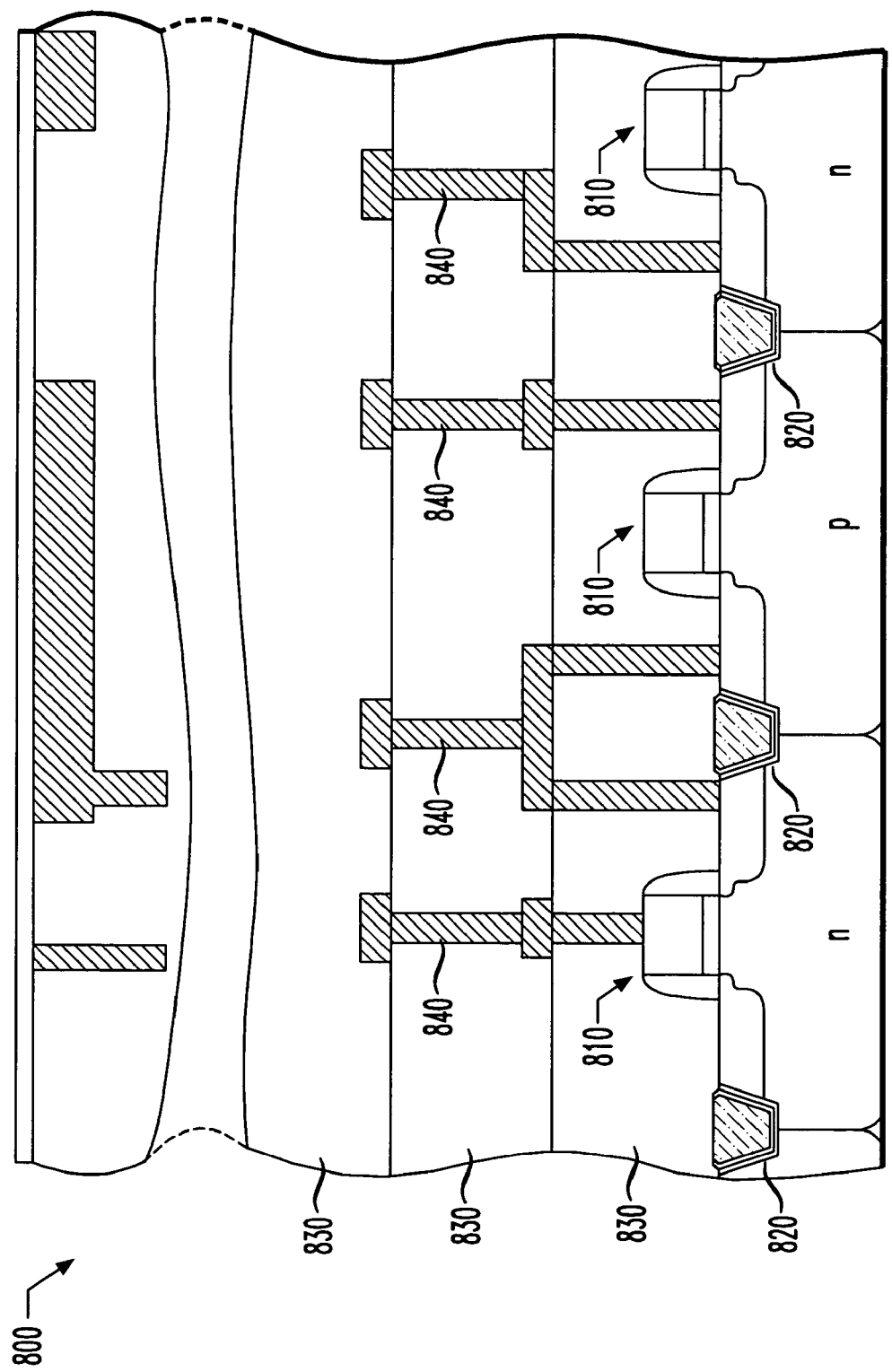
FIG. 8 illustrates a sectional view of a conventional integrated circuit (IC) incorporating semiconductor devices constructed according to the principles of the present invention.

Referring finally to FIG. 8, illustrated is a cross-sectional view of a conventional integrated circuit (IC) 800 incorporating semiconductor devices 810 constructed according to the principles of the present invention. The IC 800 may include devices, such as transistors used to form CMOS devices, BiCMOS devices, Bipolar devices, or other types of devices. The IC 800 may further include passive devices, such as inductors or resistors, or it may also include optical devices or optoelectronic devices. Those skilled in the art are familiar with these various types of devices and their manufacture. In the particular embodiment illustrated in FIG. 8, the IC 800 includes the semiconductor devices 810 located between isolation structures 820, as provided by the present invention. The IC 800 of FIG. 8 further includes dielectric layers 830 located over the semiconductor devices 810. Additionally, interconnect structures 840 are located within the dielectric layers 830 to interconnect various devices, thus, forming the operational IC 800.

Although the present invention has been described in detail, those skilled in the art should understand that they can make various changes, substitutions and alterations herein without departing from the spirit and scope of the invention in its broadest form.

What is claimed is:

1. A method for manufacturing a trench isolation structure, comprising:
   forming a hardmask over a substrate;
   etching a trench in the substrate through the hardmask;
   forming a liner in the trench, wherein the liner is below a top surface of the substrate;
   sequentially depositing an interfacial layer directly on the liner within the trench and on the hardmask, the hardmask having a thickness of less than about 100 nm, said interfacial layer having a thickness ranging from about 30 nm to about 90 nm, wherein the interfacial layer is silicon oxynitride;
   filling the trench with a dielectric material; and
   removing the dielectric material, the interfacial layer, and the hardmask layer from a surface of the substrate to form an isolation structure, such that a portion of the interfacial layer remains on a portion of the isolation structure and above the top surface of the substrate.

2. The method as recited in claim 1 wherein depositing the interfacial layer includes depositing with a gas mixture containing silicon and nitrogen wherein a flow rate of a silicon-containing gas ranges from about 150 sccm to about 250 sccm, a flow rate of an ammonia gas ranges from about 1000 sccm to about 1500 sccm, a flow rate of nitrogen gas ranges from about 25 sccm to about 100 sccm, and a temperature ranges from about 740° C. to about 800° C. and at a pressure that ranges from about 0.1 Torr to about 0.3 Torr.

3. The method as recited in claim 1 wherein depositing the interfacial layer includes depositing with a gas mixture containing silicon and nitrogen wherein a flow rate of a silicon-containing gas ranges from about 400 sccm to about 600 sccm and a flow rate of an ammonia gas ranges from about 3000 sccm to about 5000 sccm and a flow rate of nitrogen gas ranges from about 3000 sccm to about 5000 sccm and wherein a temperature during the depositing ranges from about 350° C. to about 450° C. and at a pressure ranging from about 2.5Torr to about 3.0 Torr and at a power of ranging from about 400 watts to about 600 watts.

4. The method as recited in claim 1 wherein depositing the interfacial layer includes depositing with a gas mixture containing silicon, nitrogen and oxygen wherein a flow rate of a silicon-containing gas ranges from about 100 sccm to about 150 sccm, a flow rate of a nitrogen/oxygen-containing gas ranges from about 300 sccm to about 400 sccm, a flow rate of a carrier gas ranges from about 2000 sccm to about 3000 sccm, a temperature during the depositing ranging from about 400° C. to about 450° C., at a pressure ranging from about 4 Torr to about 8 Torr and at a power ranging from about 100 watts to about 150 watts.

5. The method as recited in claim 1 wherein the interfacial layer is a silicon rich oxide layer that forms an interface at the liner and wherein depositing the interfacial layer includes depositing with a gas mixture containing silicon, oxygen and nitrogen, wherein a flow rate of a silicon-containing gas ranges from about 300 sccm to about 400 sccm, a flow rate of the nitrogen/oxygen-containing gas ranges from about 7000 sccm to about 8000 sccm, a flow rate of nitrogen gas ranges from about 1500 sccm to about 2000 sccm and at a pressure that ranges from about 1.5 Torr to about 3 Torr and a temperature ranging from about 350° C. to about 450° C. and at a power ranging from about 700 watts to about 1000watts.

6. The method as recited in claim 1, wherein the dielectric material, the interfacial layer, and the hardmask layer are removed by chemical mechanical polishing.

7. A method for manufacturing an integrated circuit, comprising:
   forming trench isolation structures in a substrate, including;
   forming a hardmask over a substrate;
   etching a trench in the substrate through the hardmask;
   forming a liner in the trench, wherein the liner is below a top surface of the substrate;
   sequentially depositing an interfacial layer directly on the liner within the trench and on the hardmask, the hardmask having a thickness of less than about 100 nm and the interfacial layer having a thickness ranging from about 30 nm to about 90 nm, wherein the interfacial layer is silicon oxynitride;
   filling the trench with a dielectric material; and
   removing the dielectric material, the interfacial layer, and the hardmask layer from a surface of the substrate to form an isolation structure, such that a portion of the interfacial layer remains on a portion of the isolation structure and above the top surface of the substrate;
   forming transistor devices over the substrate; and
   constructing an interlevel dielectric layer over the transistor devices and having interconnects located therein, wherein the interconnects contact the transistor devices to form an operative integrated circuit.

8. The method as recited in claim 7 wherein filling the trench with a dielectric material includes depositing the dielectric material within the trench.

9. The method as recited in claim 7 wherein the interfacial layer is a silicon rich oxide layer that forms an interface at the liner.

10. The method as recited in claim 7 wherein depositing the interfacial layer includes depositing with a gas mixture containing silicon, nitrogen and oxygen wherein a flow rate of a silicon-containing gas ranges from about 100 sccm to about 150 sccm, a flow rate of a nitrogen/oxygen-containing gas ranges from about 300 sccm to about 400 sccm, a flow rate of a carrier gas ranges from about 2000 sccm to about 3000 sccm, a temperature during the depositing ranging from about 400° C. to about 450° C., at a pressure ranging from about 4 Torr to about 8 Torr and at a power ranging from about 100 watts to about 150 watts.

11. The method as recited in claim 7 wherein depositing the interfacial layer includes depositing with a gas mixture containing silicon and nitrogen wherein a flow rate of a silicon-containing gas ranges from about 150 sccm to about 250 sccm, a flow rate of an ammonia gas ranges from about 1000 sccm to about 1500 sccm, a flow rate of nitrogen gas ranges from about 25 sccm to about 100 sccm, and a temperature ranges from about 740° C. to about 800° C. and at a pressure that ranges from about 0.1 Torr to about 0.3 Torr.

12. The method as recited in claim 7, wherein the dielectric material, the interfacial layer, and the hardmask layer are removed by chemical mechanical polishing.

13. A trench isolation structure, comprising:
   a trench located in a semiconductor substrate;
   a liner located in the trench, wherein the liner is below a top surface of the substrate;
   an interfacial layer located over the oxide liner within the trench, wherein the interfacial layer comprises silicon nitride and has a thickness ranging from about 30 nm to about 90 nm; and
   a dielectric material fills the trench, wherein a portion of the interfacial layer is located on a portion of the isolation structure above the top surface of the substrate and wherein the dielectric material and the interfacial layer have coplanar surfaces located above the top surface of the material.

* * * * *